(12) United States Patent
Thirunavukarasu et al.

(10) Patent No.: US 10,154,586 B2
(45) Date of Patent: Dec. 11, 2018

(54) APPARATUS AND METHOD FOR SOLID STATE SOURCE ARRAY DESIGN AND FABRICATION

(71) Applicant: APPLIED MATERIALS, INC., Santa Clara, CA (US)

(72) Inventors: Sriskantharajah Thirunavukarasu, Singapore (SG); Joseph Johnson, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 971 days.

(21) Appl. No.: 14/538,733

(22) Filed: Nov. 11, 2014

(65) Prior Publication Data
US 2016/0131352 A1     May 12, 2016

(51) Int. Cl.
| | |
|---|---|
| F26B 3/30 | (2006.01) |
| F25B 29/00 | (2006.01) |
| H01L 29/18 | (2006.01) |
| F25B 21/02 | (2006.01) |
| H05K 1/11 | (2006.01) |

(52) U.S. Cl.
CPC ... H05K 1/112 (2013.01); *H05K 2201/09845* (2013.01); *H05K 2201/10106* (2013.01); *H05K 2201/10303* (2013.01)

(58) Field of Classification Search
CPC ......... H05K 1/112; H05K 2201/09845; H05K 2201/10106; H05K 2201/10303
USPC ...... 392/411, 416, 422, 418; 257/88, 72, 84, 257/93, 98; 156/345.27, 345.24; 118/725, 724; 62/3.2, 3.3, 3.7, 177, 179, 62/180, 331, 337; 219/390, 405, 411; 165/61, 64, 80.1, 80.2, 80.4, 104.13, 165/104.14, 104.19, 104.28, 104.31, 165/104.33
See application file for complete search history.

(56) References Cited

U.S. PATENT DOCUMENTS

| | | | |
|---|---|---|---|
| 2009/0315064 A1* | 12/2009 | Wang | H01L 33/62 257/99 |
| 2014/0238970 A1 | 8/2014 | Johnson et al. | |
| 2014/0241707 A1 | 8/2014 | Johnson et al. | |
| 2014/0270731 A1 | 9/2014 | Gerling et al. | |
| 2014/0270735 A1 | 9/2014 | Gerling et al. | |

\* cited by examiner

*Primary Examiner* — Dana Ross
*Assistant Examiner* — Ket D Dang
(74) *Attorney, Agent, or Firm* — Moser Taboada; Alan Taboada

(57) ABSTRACT

Apparatus for providing pulsed or continuous energy in a process chamber are provided herein. The apparatus may include a base having a plurality of vias formed in a bottom surface of the base, and wherein an electrical connector is disposed in each via, a first metallic layer disposed on a top surface of the base and electrically coupled to the electrical connectors disposed in the plurality of via, and a plurality of solid state light sources disposed on a top surface of the metallic layer and electrically coupled to the metallic layer.

17 Claims, 6 Drawing Sheets

APPARATUS AND METHOD FOR SOLID STATE SOURCE ARRAY DESIGN AND FABRICATION

FIELD

Embodiments of the present disclosure generally relate to semiconductor processing systems and, more specifically, to solid state light sources for use in semiconductor processing systems.

BACKGROUND

Several applications that involve the thermal processing of substrates such as semiconductor substrates and other materials involve the process steps of rapidly heating and cooling a substrate. Examples of such processing include rapid thermal processing (RTP), physical vapor deposition (PVD) processing, and the like, which are used for a number of semiconductor fabrication processes.

During semiconductor fabrication processing, heat energy from lamps is radiated into the process chamber and onto a semiconductor substrate in the processing chamber. In this manner, the substrate is heated to a specific processing temperature. Typically, the use of conventional lamps (tungsten-halogen, mercury vapor, arc discharge) or electrical heating elements has been the dominant approach to delivering energy to the substrate for dopant annealing, film deposition, or film modification. These processes are often thermally based and typically use high process temperatures ranging from 200 C to 1600 C, which can result in significant thermal budget issues that adversely affect device performance. In addition, the use of conventional lamps has associated high maintenance costs with respect to operating lifetime, material and energy usage. Conventional lamps emit radiation over a broad spectrum of wavelengths which can be detrimental to some instrumentation and/or result in an unintended response in the target substrate/film from the undesired wavelengths.

Arrays of solid state light sources, for example Light Emitting Diodes (LEDs), may be used instead of, or in addition to, conventional lamps for various semiconductor fabrication processes to address some of the foregoing issues. In order to achieve target irradiance levels on the order of 1e6 W/m^2 that are comparable to the intensities used for RTP, high packing density of LEDs would need to be used. However electrical standards call for a minimum spacing between conductors of different voltages to prevent electrical leakage and breakdown on a circuit board. This limits the configuration of LEDs for high voltage operation since the LEDs cannot be spaced too closely.

Accordingly, the inventors have provided an improved high density solid state light source array for use in semiconductor processing systems.

SUMMARY

Apparatus for providing pulsed or continuous energy in a process chamber are provided herein. The apparatus may include a base having a plurality of vias formed in a bottom surface of the base, and wherein an electrical connector is disposed in each via, a first metallic layer disposed on a top surface of the base and electrically coupled to the electrical connectors disposed in the plurality of via, and a plurality of solid state light sources disposed on a top surface of the metallic layer and electrically coupled to the metallic layer.

In some embodiments, an energy source for providing light and heat energy to a process chamber may include a heat exchanger, a metallic plate coupled to a top surface of the heat exchanger, a power distribution board disposed on a top surface of the metallic plate, the power distribution board including a plurality of openings formed through the power distribution board, and a plurality of solid state light source arrays, wherein each solid state light source array is electrically coupled to a top surface of the power distribution board, and wherein a least a portion of each solid state light source array is disposed through at least one of the plurality of openings to contact the metallic plate.

In some embodiments, a method of fabricating a solid state light source array may include depositing a metallic material in a plurality of vias formed in a base, disposing a spring-loaded compressible electrical connector in each via that electrically contacts the metallic material deposited in the vias, depositing a first metallic layer on a top surface of a base that electrically contacts the metallic material, and mounting a plurality of solid state light sources on a top surface of the first metallic layer.

Other embodiments and variations of the present disclosure are disclosed in greater detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are not to be considered limiting of its scope, for the disclosure may admit to other equally effective embodiments.

Figure 1:
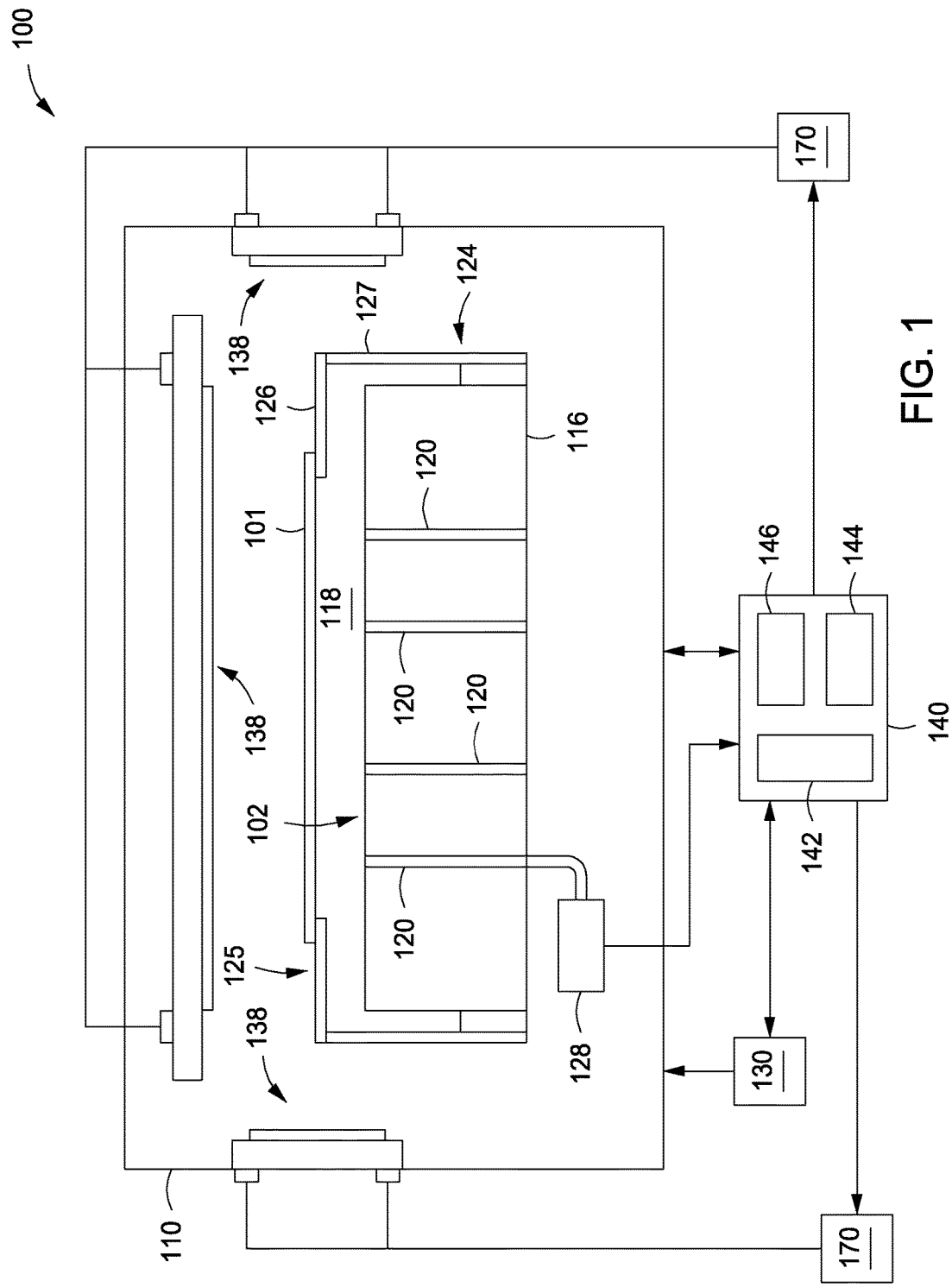
FIG. 1 is a schematic, cross-sectional view of a semiconductor substrate process chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation. In addition, as used herein, relational terms, such as "first" and "second," "top" and "bottom," "upper" and "lower" and the like, may be used solely to distinguish one entity or element from another entity or element without necessarily implying any physical or logical relationship or order between such entities or elements.

DETAILED DESCRIPTION

Embodiments of an apparatus and method for solid state source array hardware design and fabrication for providing pulsed or continuous energy in a process chamber are provided herein. In some embodiments, the inventive apparatus may advantageously provide improved heating of substrates and other components disposed in a process chamber through the use of solid state light sources.

In the following description, the term substrate is intended to broadly cover any object that is being processed in a thermal process chamber. The term substrate may include, for example, semiconductor substrates, flat panel displays, glass plates or disks, plastic workpieces, and the like. In the following description solid state light sources include light emitting diodes (LEDs) and LASERs. In addition, although described below in terms of LEDs or arrays of LEDs, LASERs and arrays of LASERs, other solid state light sources may be used interchangeably in embodiments described herein.

FIG. 1 depicts a schematic of an exemplary process chamber 100 configured to perform thermal processes, such as a rapid thermal process (RTP), and suitable for use with the inventive LED source for heating substrates in accordance with some embodiments of the present disclosure. The process chamber 100 may be any type of process chamber having a substrate support configured to support a substrate (e.g., process chamber that includes a substrate support ring, a susceptor which holds the substrate in multiple places, air jets that holds the substrate in place) and having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a energy source 138, which may include a plurality of LEDs or array(s) of LEDs arranged in zones, wherein each zone of LEDs is separately controllable. In some embodiments, the energy source 138 may be a conventional lamp augmented with LEDs strewn about areas of the lamp head that had previously not been a light-emitting surface, increasing usage of the heat source surface area.

In FIG. 1, energy sources 138 are shown above the substrate 101 for heating an upper surface of the substrate 101, and on each side of the substrate 101 (which may be used, for example, to heat edge ring 126 which contacts substrate 101). Alternatively, energy sources 138 may be configured provide pulsed and/or continuous energy in process chamber 100. In some embodiments, energy source 138 may be used to heat the back side of the substrate 101, for example, such as by being disposed below the substrate 101, or by directing the radiation to the back side of the substrate 101. Each energy source 138 is coupled to one or more power sources 170 which may be coupled to controller 140 to separately control each energy source 138. The temperatures at localized regions of the substrate 101 are measured by a plurality of temperature probe assemblies, such as 120, that passes through a through a hole that extends from the back side of the base 116 through the top of a reflector plate 102. However, since the monochromatic properties of LEDs will not cause pyrometer interference, in some embodiments, temperature measurements may advantageously be obtained via pyrometers disposed anywhere in the chamber. The temperature probe assemblies 120 transmit sampled light from the reflecting cavity 118 to a pyrometer 128. The pyrometer 128 is connected to controller 140 which controls the power supplied to the energy source 138 (e.g., a lamp head) in response to a measured temperature. The energy sources 138 may be divided into multiple zones. The zones can be individually adjusted by the controller to allow controlled radiative heating of different areas of the substrate 101. In other embodiments, each light (LED or conventional light source) in energy sources 138 may be separately controlled to facilitate even finer control of the radiative heating.

In some embodiments, energy sources 138 can be placed on robot blades to activate or heat substrate 101 while the substrate is moving between process chambers. That is, in some embodiments, energy sources 138 (e.g., an LED source array) can be disposed in a process chamber, or can be placed on a robot that transfers a substrate 101 from one process chamber to another.

In some embodiments, a cooling mechanism may be used to cool the energy sources 138. Some exemplary cooling mechanisms may include, for example, the use of heat sinks coupled to or grown on (as discussed below) a backside of the energy sources 138. In some embodiments, the substrate on which the light sources are mounted or grown on may itself be a heat sink used for cooling. In other embodiments, energy sources 138 may be cooled by a gas or liquid circulated around or proximate to the energy sources 138.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

Figure 2:
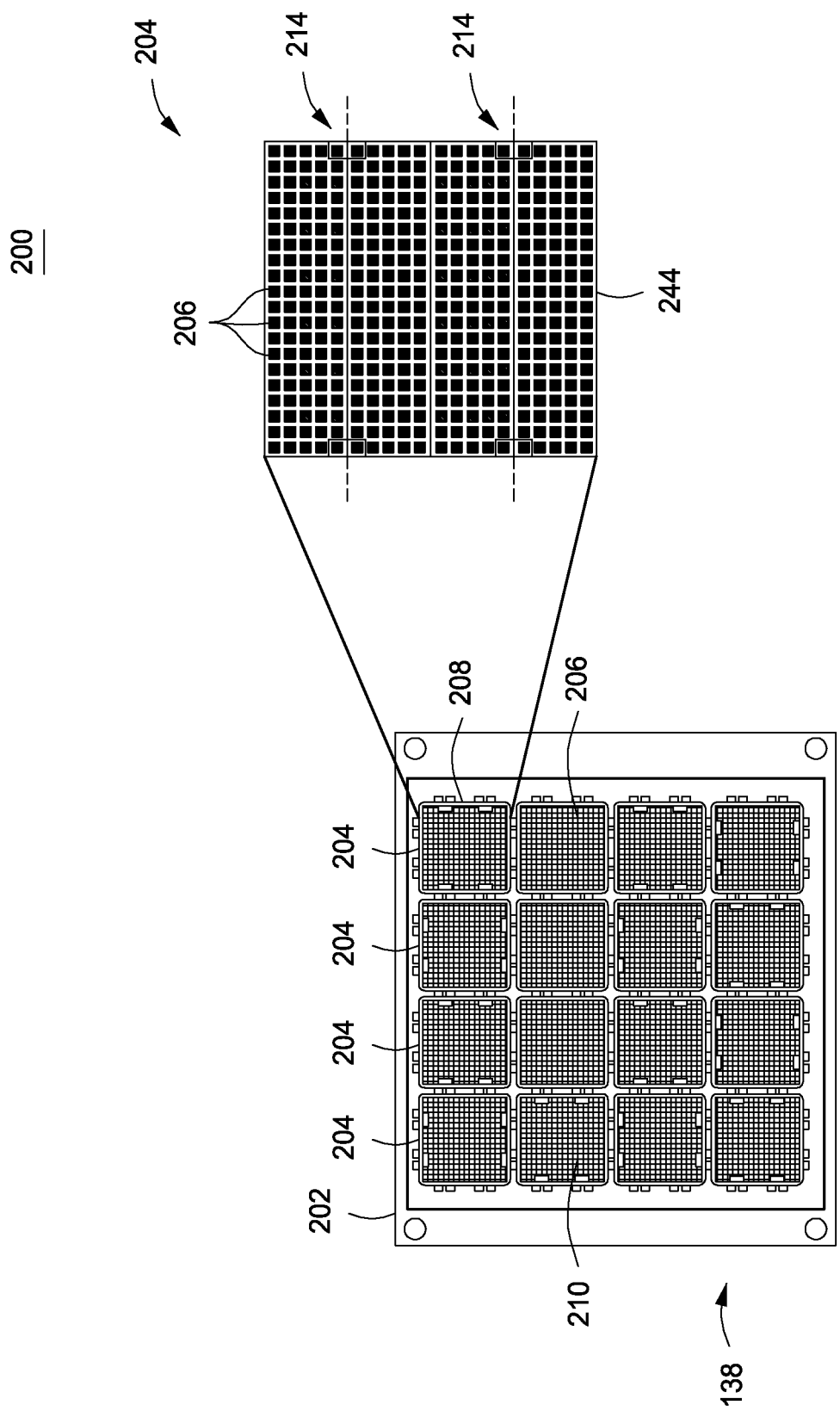
FIG. 2 is a top view of an solid state light source that includes a plurality of solid state source arrays in accordance with some embodiments of the present disclosure.

During processing, the substrate 101 is disposed on the substrate support 124. The energy source 138 is a source of radiation (e.g., heat) and, in operation, generates a predetermined temperature distribution across the substrate 101. In embodiments, where the heat source includes LEDs (as shown in FIG. 2), the energy source 138 may provide energy in wavelengths ranging from ultraviolet wavelengths to infrared wavelengths (e.g., about 100 nanometers (nm) to about 2000 nanometers (nm)). In some embodiments LED energy source 138 may provide energy in the microwave wavelength range. The LED energy source 138 provides heat radiation that is absorbed by the substrate 101. Although some of the heat radiation produced by an LED source may be reflected, substantially all of the heat radiation that is not reflected is absorbed by the target component being heated. In embodiments described herein, the substrate 101 may bow, for example up to about 5 mm, during heating. Thus, in some embodiments, the LED energy source 138 should be placed just far enough away to avoid contact if the substrate 101 bows, but close enough to provide a uniform heat energy to the target substrate. In some embodiments, the LED energy source 138 may be bowed or shaped to compensate for the target substrate deformation.

In the exemplary processing chamber 100 described above, energy source 138 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, LED energy sources 138 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used, to process the near surface region of a substrate. LEDs last a long time and allow the output intensity to be chosen independent from the wavelength(s) of the output illumination. Light emitting diodes (LEDs) may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thus heating the substrate more efficiently.

In some embodiments, each energy source 138 in FIG. 1 may include one large array of LEDs. However, depending on the heat energy and area to be heated, one large array of LEDs may use more power than can safely be provided without damage to the LEDs and associated circuitry. The inventors have observed that by modularizing LEDS into a plurality of smaller LED arrays, the smaller LED arrays can be more easily handled, manufactured, and powered. In addition, a plurality of smaller arrays of LEDs may also help in the event of LED failure. For example, in some embodiments, if one led fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

FIG. 2 shows at least one exemplary embodiment of an energy source 138 that includes a plurality of LED arrays 204 disposed on a LED structural support base 202 for thermally processing other substrates and/or heating various processing chamber components disposed in the processing chamber. Each LED array 204 is also referred to herein as an LED cell assembly or an LED array assembly which includes multiple layers and structural elements as will be described below with respect to FIG. 3 in more detail.

In some embodiments, energy source 138 may illustratively be between 100 mm and 480 mm in length and between 100 mm and 480 mm in width. In addition, various size energy sources 138 may be used as desired in any particular application. In some embodiments, each LED array 204 may be about 20 mm by about 20 mm square, although other size LED arrays 204 may be used. Each LED array 204 may contain between about 50 LEDs to about 500 LEDs 206 (e.g., 441 LEDs as shown in FIG. 2B). LEDs 206 may be spaced between about 0.1 mm and about 0.5 mm apart. LED arrays 204 may be spaced between about 0.5 mm and about 4 mm apart. Each LED 206 in LED arrays 204 may emit light and heat energy from one or more exposed surfaces. In some embodiments, all exposed surfaces of each LED 206 may emit light and heat energy. In some embodiments, each LED may be about 0.85 mm by about 0.85 mm square and about 0.3 mm in height, although other size LED 206 may be used. LEDs 206 may emit wavelengths in the Ultra Violet (UV) (200-400 nm), visible light (400-700 nm) and near infrared (700-1000 nm) wavelength ranges. In some embodiments that use high intensity output, the optical output of LEDs 206 are on the order of 1 W/mm^2 or greater, which corresponds to a target irradiance of 8e5 W/m^2 with sufficiently high packing densities. With sufficiently high packing densities of LEDs 206 over a given area, the LED arrays 204 advantageously provide the ability to achieve rapid thermal processing. In addition, LEDs can also be operated at a lower intensity for other processes that do not use high power. The wide range of available wavelengths for LEDs advantageously enable wavelength specific, high intensity sources for industrial applications. Multi-wavelength capability can be realized in a single LED array 204 or across multiple LED arrays 204 in a system.

In addition, LEDs 206 and LED arrays 204 have faster on-off switching times than incandescent lamps. In some embodiments, the LEDs have on-off switching times on the order of nanoseconds versus hundreds for milliseconds for incandescent lamps. Specifically, in some embodiments, the LEDs have a switch-on time from about 0.5 nanoseconds to about 10 nanoseconds and a switch-off time from about 0.5 nanoseconds to about 10 nanoseconds. Faster on-off switching times enables shorter thermal exposures. The use of small form factor LEDs as described above makes it possible to design conformal high intensity illumination systems at a lower cost of ownership, longer operating lifetime (~100 k hours) and in the case of UV LEDs, an environmentally sensitive alternative to toxic mercury vapor based lamps.

In some embodiments, the LED array 204 can be individual LED chips 206 with different wavelengths, or the LED array 204 can be a collection of LED lamps with different wavelengths. The LEDs can be multiplexed/rasterized such that certain LEDs with certain wavelengths are activated at one time. For example, at time 1t, only λ1 LEDs are active, at time 2t only λ2 LEDs are active, etc. Thus, the LEDs in LED array 204 can be grouped and separately controlled by a controller (e.g., controller 140).

In some embodiments, reflectors 208, 210 are configured to reflect the light and heat energy emitted from the LED towards the desired target (e.g., substrate, or other process chamber component, etc.). In the case of LASERS, the reflectors 208, 210 could direct the light off of the LASER beams' axis to heat a substrate or desired process chamber component. The reflectors 208 and 210 may be angled to reflect radiated LED light in a desired direction. In some embodiments, the angles of the incline of the reflector surfaces from the LED array 204 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210 may be perpendicular to the surface of the LED array 204. Still, in other embodiments, the surface of the LEDs 206 may be angled instead of, or in addition to, the surface of the reflector. In some embodiments, the height of the reflectors 208, 210 is at least the same height as the height of the LEDs 206, but may be higher or lower than the LEDs 206.

In some embodiments each LED 206 may be individually mounted on an LED substrate. In some embodiments, each LED 206 may be mounted to the substrate via a flip-chip mounting process. Using flip-chip technology, the LED is mounted upside down compare to the present day LED production. Thus, the electrical connections are located on the bottom of the LEDs as will be described below in further detail with respect to FIGS. 3 and 4. In other embodiments, each LED 206 may be mounted to the substrate via eutectic bonding, including wire-bond-free direct attach LEDs. To direct attach LEDs to a substrate, a flux is first disposed on the substrate surface to which the LEDs will be attached. The LEDs are then disposed over this surface. The LEDs and the surface are then heated with a certain heating profile. An amount of solder disposed on the bottom of the LED will melt with help of the flux, and will attach the LED to the fluxed surface. In some embodiments, each LED 206 may be grown on LED substrate. The LEDs 206 may be individually grown, grown in groups/sections, or grown all together at the same time. In some embodiments, the LED substrate that LEDs 206 are grown on may be an n-type substrate, with an electrode (e.g., 214) attached to the p-type layer 240 deposited on its surface. Silicon substrates or sapphire substrates may be used as well. The substrate can be any material that is thin enough, or has a high thermal conductivity, such that it is able to dissipate heat from the LEDs quickly while also providing electrical isolation of the LEDs from the rest of the system. This can be done by using an electrically isolating material. LEDs can be grown on any material where the lattice structure of the substrate can be made to match the lattice structure of the LED material through, but not limited to, direct deposition, application of a buffer layer, and/or any type of stress relaxation. In some exemplary embodiments, the substrate can be ceramic. In some embodiments, islands of non-substrate material/chemistries may be grown or included in the substrate to help facilitate LED growth.

Figure 3A:
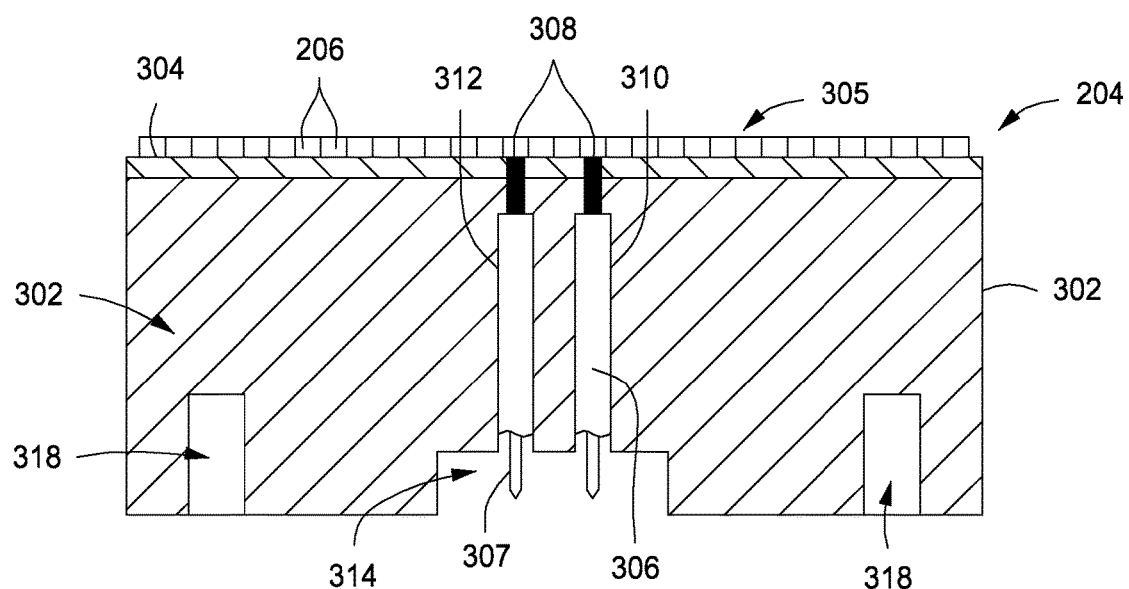
FIGS. 3A and 3B are schematic side and bottom views, respectively, of a portion of a solid state source array in accordance with some embodiments of the present disclosure.
Figure 3B:
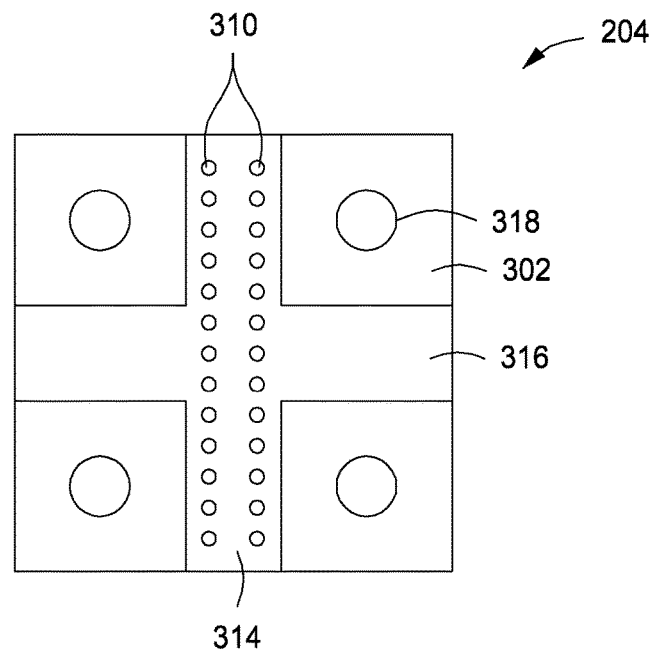
Figure 3C:
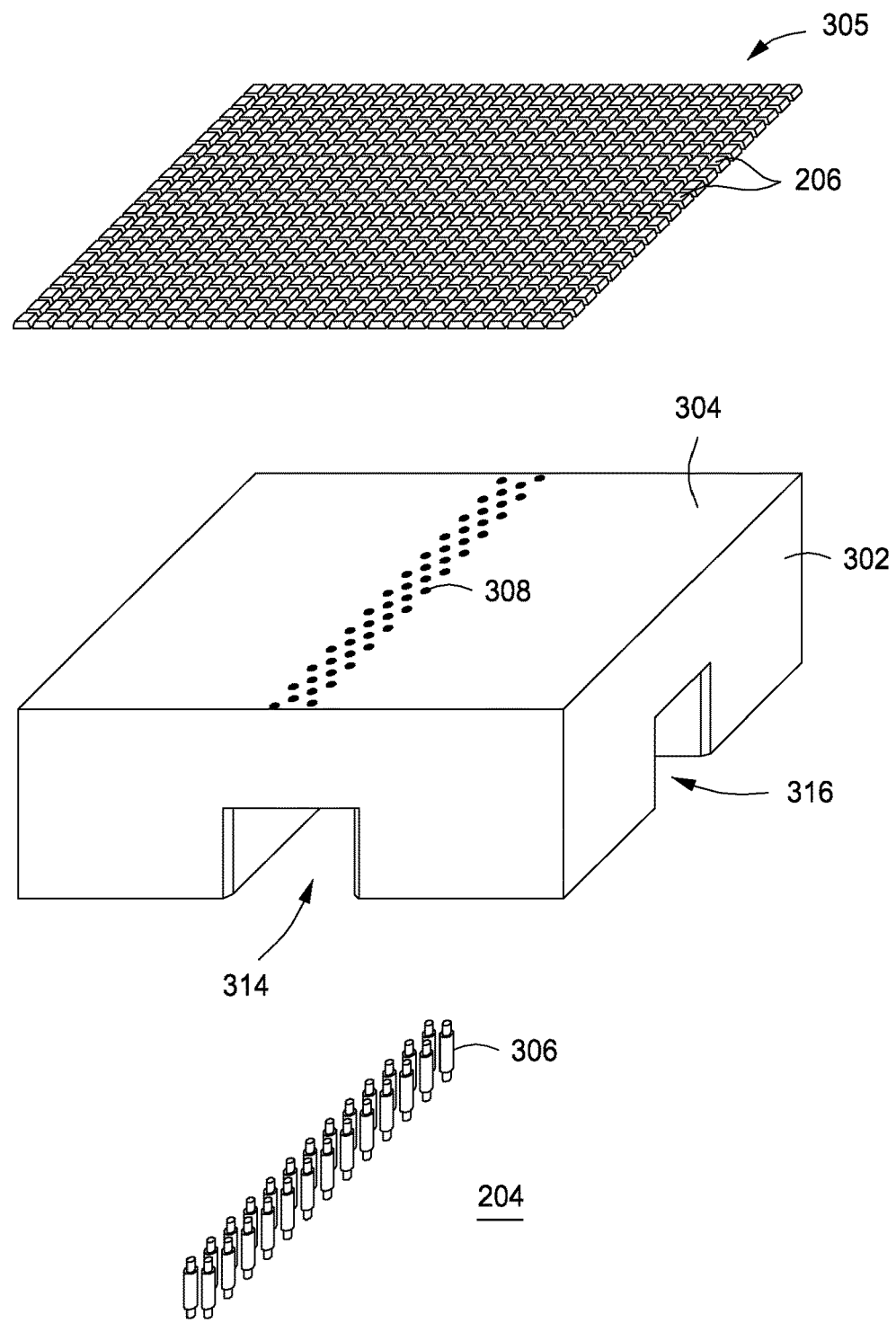
FIG. 3C is an isometric view of an solid state source array assembly in accordance with some embodiments of the present disclosure.

FIGS. 3A and 3B are schematic side and bottom views, respectively, of a portion of a solid state source array (e.g., LED array 204), in accordance with some embodiments of the present disclosure. FIG. 3C is an isometric view of an solid state source array assembly in accordance with some embodiments of the present disclosure. The inventors observed that in existing LED array cell designs, the use of pogo pins that included two spring loaded ends caused delamination of some of the layers of the LED cell. Thus, the inventive LED array 204 advantageously avoids the delamination issues observed, while providing an efficient design with a small form factor in order to produce an efficient high density LED array. In addition, the inventive LED array 204 advantageously reduces the number of layers included in each LED cell array 204.

The LED array 204 includes a base 302 made of thermally conductive material. The base 302 may be made out of aluminum nitride (AlN) or other thermally conductive material to effectively remove heat from the LED light/heat sources. The thermally conductive material used should function as both a high thermal conductor as well as a low electrical conductor. If a materials that has high thermal conductivity as well as high electrical conductivity is used, a dielectric layer is included in between the thermally conductive material and the base, increasing the thermal resistance on the module. some embodiments, the base 302 may include one or more fastener holes 318. The fastener holes 318 may be mechanically drilled holes, gun drilled holes or made using a water jet. The fastener holes 318 may be used to house heli-coils or other types of fasteners to secure the LED array to a support and power distribution structure.

The base 302 includes at least one first channel 314 machined along the bottom surface of base 302, and at least one second channel 316 machined perpendicularly to channel 314 along the bottom surface of base 302. A plurality of vias 310 may be formed within channel 314 as shown in FIGS. 3A and 3B. The vias 310 may be mechanically drilled, gun drilled, or formed using a water jet. The vias 310 may include a first wider portion to accommodate a pogo pin 306 or other electrical connector which extends partially into base 302. The vias 310 also include second more narrow portion 308 that extends from the first wider portion to an upper surface of base 302. The first wider portion of each via 310 may be about 0.5 mm to about 2.0 mm in diameter. The second narrow portion 308 may be about 0.1 mm to about 0.5 mm in diameter.

The vias 310 may be filled with an electrically conductive material layer 312. The vias 310 may be filled with the electrically conductive material 312 through a chemical deposition process or other type of deposition process. In some embodiments, the electrically conductive material 312 may include tungsten, copper, titanium, and the like.

An electrically conductive pogo pin is inserted into each via 310. The pogo pins used in the inventive LED array 204 are electrically conductive connectors that include electrically conductive spring-loaded connectors 307 on one end. In other embodiments, the pogo pins may include electrically conductive spring-loaded connectors 307 on both ends. In some embodiments, the pogo pins 306 may include an electrically conductive outer coating (e.g., gold, etc.) that contacts the electrically conductive material 312 deposited in vias 310. Each pogo pin 306 may be about 0.5 mm and diameter to about 2 mm in diameter. Thus, when a pogo pin is inserted into via 310, an electrical path is formed between the spring-loaded connector 307 disposed along the bottom surface of base 302 and the tungsten filled vias 310 on the upper surface of the base 302. In some embodiments, other types of electrical connectors which may not be spring loaded may be used in place of pogo pins 306.

In some embodiments, a thin metallic layer 304 may be disposed on a top surface the 302. In some embodiments, the thin metallic layer 304 may completely cover the top surface of base 302, while in other embodiments, it may cover only a portion of the top surface of base 302. The thin metallic layer may be fabricated from copper, tungsten, or other material that is both electrically conductive and thermally conductive. The metallic layer 304 may be between 10 μm and about 0.5 mm in thickness. A metallic layer 304 covers and is electrically coupled to the tungsten filled vias 310. In some embodiments, the tungsten filled vias 310 do not connect directly to the metallic layer 304 at the center. Instead, the electricity provided through the tungsten filled vias 310 are transported to the outside of each string of LEDs (discussed below).

In some embodiments, a thin layer of additional material, such as tantalum, may be used to secure the metal layer 304 to upper surface of base 302.

A plurality of LEDs 305, consisting of individual LEDs 206, is then mounted on, and electrically coupled to, the metallic layer 304. The plurality of LEDs 305 may be mounted on metallic layer 304 as discussed above with respect to FIG. 2. In some embodiments, multiple strings of LEDs 206 may be disposed on metallic layer 304. In some embodiments, the multiple parallel strings of LEDs 206 will be disposed on metallic layer 304, where each parallel string includes an electrical connection on each end that may be electrically connected to the tungsten filled vias 310. In some embodiments, each row of LEDs 206 is independent from all other rows of LEDs 206. The multiple parallel strings may be disposed from high voltage to low voltage and run from left to right, for example.

In some embodiments, the LEDs 206 in LED arrays 204 are connected in series. Still, in other embodiments, the LEDs 206 are disposed on metallic layer 304 in a recursive pattern on the upper surface of metallic layer 304. The recursive pattern maximizes the use of the available surface area of the upper surface of metallic layer 304. In some embodiments, the recursive pattern is a serpentine structure including a plurality of rows of LEDs 206, such that each row of LEDs 206 is electrically coupled to at least one other row of LEDs 206. The distance between each row of LEDs is selected to minimize a current leakage between each row of LEDs.

Figure 4:
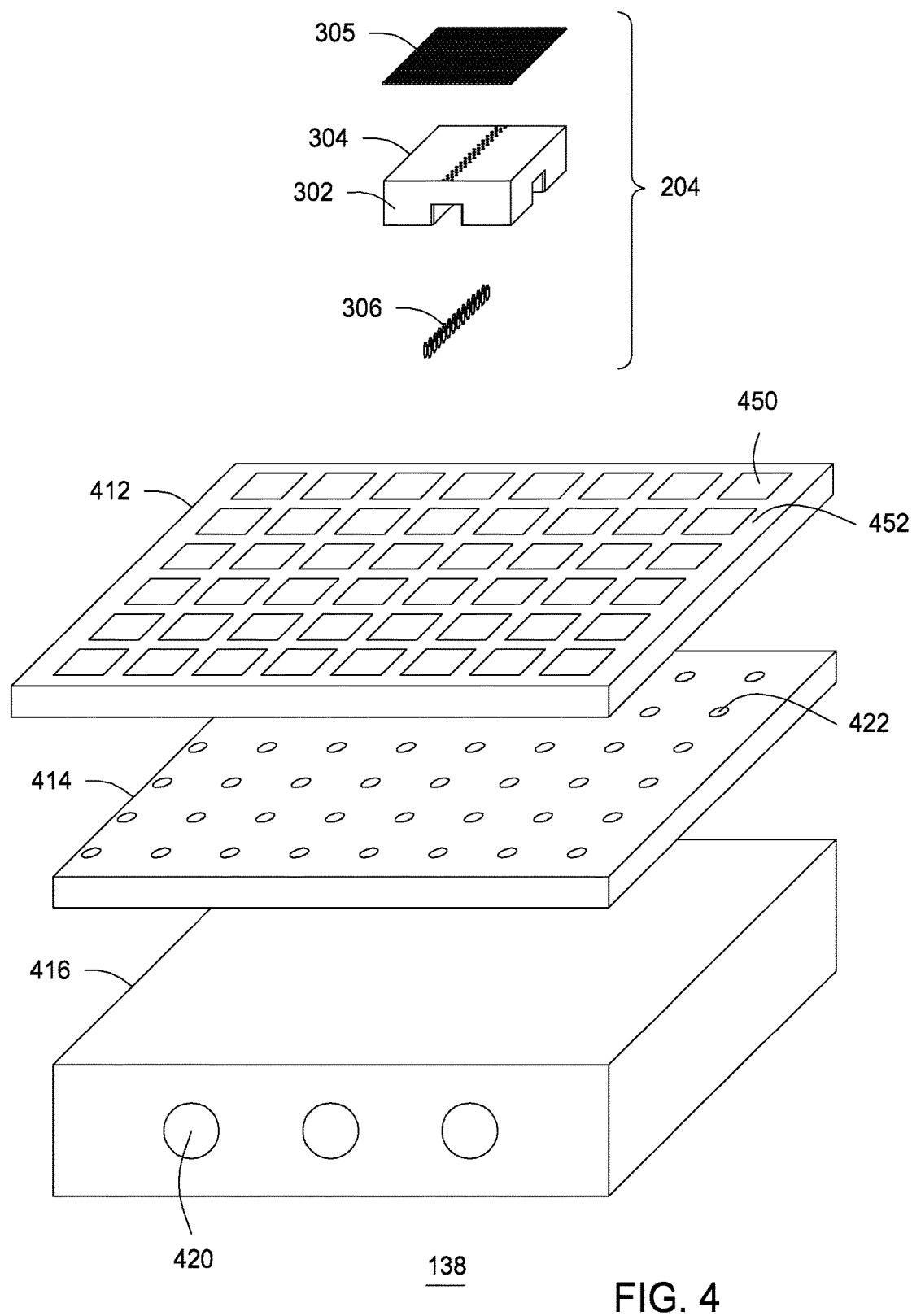
FIG. 4 is isometric views of an energy source including an solid state source array assembly in accordance with some embodiments of the present disclosure.

FIG. 4 is an isometric view of the energy source 138, in accordance with some embodiments of the present disclosure. In FIG. 4, the LED array 204 is described above with respect to FIGS. 2 and 3A-3C. Each LED cell array 204 may be disposed within some of the openings 450 of the power distribution printed circuit board (PCB) 412. In some embodiments, each LED array 204 may be disposed within four openings 450 such that the upper surface 452 of PCB 412 fits into channels 314 and 316 of base 302. The upper surface 452 of PCB 412 contacts the spring-loaded connectors 307 of pogo pins 306. The PCB 412 supplies power to the LED array 204, via pogo pins 306, and controls the voltage supplied to the LEDs 206. In some embodiments, at least some of the openings 450 may be sized to accommodate more than leg of each LED cell 204. For example, in order to more densely packed LED arrays 204, each interior opening 450 may be able to accommodate two legs of each LED array 204.

The portions of the base 302 that pass through PCB 412 may be secured to plate 414. Specifically, fasteners disposed within fastener holes 318 may secure LED array 204 to plate 414 via corresponding fastener holes 422 formed in plate 414. Plate 414 may be fabricated from an electrically and thermally conductive material such as, for example, copper or aluminum. Thus, PCB 412 is secured between LED arrays 204 and plate 414 as each LED array 204 is fastened to plate 414.

Plate 414 may be fastened to a heat exchanger 416 that is designed to remove heat from the energy source 138. In some embodiments, plate 414 maybe fastened to heat exchanger 416 using a thermal paste or thermal grease. In other embodiments, plate 414 may be mechanically fastened to heat exchanger 416. Heat exchanger 416 may be made from copper, aluminum nitride, or other thermally conductive material that can efficiently function as a heat sink. Heat exchanger 416 may also include a plurality of cooling channels 420 to help cool energy source 138. Fluid or air coolant may be flow through cooling channels 420. In some embodiments, the plate 414 may not be used and the bottom portion of each leg of each base 302 of each LED assembly is fastened directly to the heat exchanger 416.

In some embodiments, when assembled, only the pogo pins and bottom portion of the channels 314 and 316 contact the upper surface of PCB 412. Meanwhile, the bottom portion of each leg of each base 302 of each LED assembly is in contact with the plate 414 which advantageously maximizes heat dispersion and cooling of the LED array 204 and PCB 412.

In alternate embodiments, the base 302 may have a substantially planar bottom surface with the vias 310 formed therein (including the pogo pins 306 disposed in each via). The pogo pins 306 may electrically contact the upper surface of PCB 412. The Plate 414 may include channels on the upper surface that are disposed through the openings 450 of PCB 412 to contact the bottom surface of base 302 to remove heat from the base 302.

Figure 5:
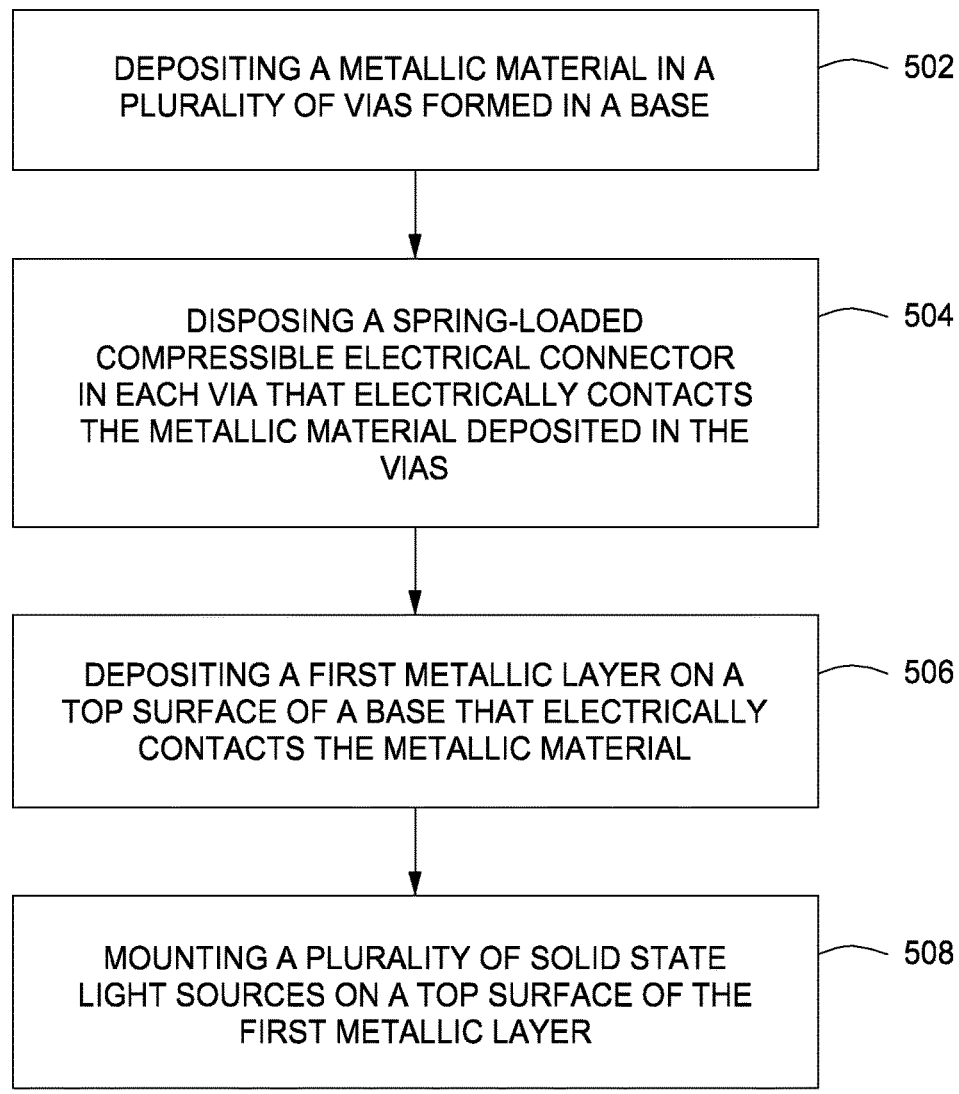
FIG. 5 is a flow chart for a method of fabricating a solid state source array in accordance with some embodiments of the present disclosure.

FIG. 5 is a flow chart for a method of fabricating a solid state source array in accordance with some embodiments of the present disclosure. The method begins at 502 wear a metallic material layer (e.g., layer 312) is deposited into the plurality of vias 310 formed in the base 302 as described above. In some embodiments, the metallic material may be tungsten, copper, and the like. The metallic material may coat the inner surfaces of the vias 310 and completely fill the narrow portions of the vias 308.

At 504, the spring-loaded compressible electrical connectors (e.g., pogo pins 306) are disposed within each via an electrically contact the metallic material layer 312 deposited in each of the vias 310 as described above with respect to FIGS. 3A through 3C. At 506, a first metallic layer (e.g., metallic layer 304) is deposited on a top surface of these 302. The first metallic layer electrically contacts the metallic material 312 deposited in vias 310. In some embodiments, a metallic material 312 may extend through metallic layer 304. At 508, a plurality of solid-state light sources (e.g., plurality of LEDs 305) are mounted on a top surface of the first metallic layer, as described above with respect in FIG. 3A-3C.

While the foregoing is directed to embodiments of the present disclosure, other and further embodiments of the disclosure may be devised without departing from the basic scope thereof.

The invention claimed is:
1. An apparatus for providing pulsed or continuous energy, the apparatus comprising:
 a base having a plurality of vias formed in a bottom surface of the base, and wherein an electrical connector is disposed in each via;
 a first metallic layer disposed on a top surface of the base and electrically coupled to the electrical connector disposed in the plurality of vias; and
 a plurality of solid state light sources disposed on a top surface of the first metallic layer and electrically coupled to the first metallic layer,
 wherein each via includes an electrically conductive material is deposited in each via, and wherein the electrical connector disposed in each via is a spring-loaded compressible electrical connector.

2. The apparatus of claim 1, wherein the electrical connector is spring-loaded on only one end.

3. The apparatus of claim 1, wherein the electrical connector contacts the electrically conductive material deposited in each via and forms an electrical path from the bottom surface of the base to the top surface of the base.

4. The apparatus of claim 3, wherein a first channel is formed in the bottom surface of the base, and wherein the plurality of vias are formed in a bottom surface of the first channel.

5. The apparatus of claim 4, wherein the base includes a second channel formed in the bottom surface of the base, wherein the second channel is perpendicular to the first channel.

6. The apparatus of claim 1, wherein each of the plurality of solid state light sources are light emitting diodes (LEDs).

7. The apparatus of claim 1, wherein each via includes a first portion that extends from the bottom surface of the base partially into the base and a second portion that extends from the first portion to the top surface of the base, and wherein the electrically conductive material completely fills the second portion.

8. An apparatus for providing pulsed or continuous energy, the apparatus comprising:
a base having a plurality of vias formed in a bottom surface of the base, and wherein an electrical connector is disposed in each via;
a first metallic layer disposed on a top surface of the base and electrically coupled to the electrical connector disposed in the plurality of vias; and
a plurality of solid state light sources disposed on a top surface of the first metallic layer and electrically coupled to the first metallic layer,
wherein the base includes a plurality of fastener holes formed in the bottom surface of the base.

9. An energy source for providing light and heat energy to a process chamber, the energy source comprising:
a heat exchanger;
a metallic plate couple to a top surface of the heat exchanger;
a power distribution board disposed on a top surface of the metallic plate, the power distribution board including a plurality of openings formed through the power distribution board; and
a plurality of solid state light source arrays, wherein each solid state light source array is electrically coupled to a top surface of the power distribution board, and wherein a least a portion of each solid state light source array is disposed through at least one of the plurality of openings to contact the metallic plate.

10. The energy source of claim 9, wherein each solid state light source array includes:
a base having a first channel and a second channel formed in a bottom surface of the base, wherein the base includes a plurality of vias formed in a bottom surface of the first channel, and wherein an electrical connector is disposed in each via;
a first metallic layer disposed on a top surface of the base and electrically coupled to the electrical connector disposed in the plurality of vias; and
a plurality of solid state light sources disposed on a top surface of the first metallic layer and electrically coupled to the first metallic layer.

11. The energy source of claim 10, wherein the second channel is perpendicular to the first channel.

12. The energy source of claim 11, wherein each solid state light source array is disposed within four openings such that the top surface of the power distribution board is disposed in the first and second channels.

13. The energy source of claim 10, wherein each via includes a first portion that extends partially into the base and a second portion that extends from the first portion to the top surface of base, wherein surfaces of the first portion of each via include a layer of electrical material deposited in each via, and wherein the second portion of each via is filled with the electrical material.

14. The energy source of claim 10, wherein the electrical connector disposed in each via is a spring-loaded compressible electrical connector.

15. The energy source of claim 14, wherein the top surface of the power distribution board electrically contacts and compresses the spring-loaded compressible electrical connector disposed in each via.

16. The energy source of claim 10, wherein the power distribution board supplies power to the plurality of solid state light source arrays.

17. The energy source of claim 10, wherein each of the plurality of solid state light sources are light emitting diodes (LEDs).

* * * * *